(12) United States Patent
Yu et al.

(10) Patent No.: US 12,132,447 B2
(45) Date of Patent: Oct. 29, 2024

(54) 5G DUAL-BAND UP-MIXER WITH SWITCHING BETWEEN AMPLIFICATION FUNCTION AND FREQUENCY MIXING FUNCTION, AND TERMINAL

(71) Applicant: University of Electronic Science and Technology of China, Chengdu (CN)

(72) Inventors: Yiming Yu, Chengdu (CN); Kai Kang, Chengdu (CN); Chenxi Zhao, Chengdu (CN); Huihua Liu, Chengdu (CN); Yunqiu Wu, Chengdu (CN)

(73) Assignee: University of Electronic Science and Technology of China, Chengdu (CN)

( * ) Notice: Subject to any disclaimer, the term of this patent is extended or adjusted under 35 U.S.C. 154(b) by 0 days.

(21) Appl. No.: 18/262,527

(22) PCT Filed: Jan. 13, 2023

(86) PCT No.: PCT/CN2023/072102
§ 371 (c)(1),
(2) Date: Jul. 21, 2023

(87) PCT Pub. No.: WO2023/221542
PCT Pub. Date: Nov. 23, 2023

(65) Prior Publication Data
US 2024/0267002 A1   Aug. 8, 2024

(30) Foreign Application Priority Data

May 18, 2022  (CN) .......................... 20221054248.8

(51) Int. Cl.
*H03D 7/14*  (2006.01)
*H04B 1/00*  (2006.01)

(52) U.S. Cl.
CPC ......... *H03D 7/1458* (2013.01); *H03D 7/1441* (2013.01); *H04B 1/005* (2013.01)

(58) Field of Classification Search
CPC ...... H03D 7/1458; H03D 7/1425; H03D 7/14; H03D 7/1441; H03D 7/1475; H03D 7/1483; H03D 7/1491
See application file for complete search history.

(56) References Cited

U.S. PATENT DOCUMENTS

2023/0283317 A1*  9/2023  Huang ................... H04B 1/408
                                              455/552.1

FOREIGN PATENT DOCUMENTS

CN         114499413 A       5/2022

OTHER PUBLICATIONS

PCT/CN2023/072102—Written Opinion of the International Searching Authority, mailed Apr. 17, 2023, 8 pages. (with English translation).

* cited by examiner

*Primary Examiner* — Diana J. Cheng
(74) *Attorney, Agent, or Firm* — Getech Law LLC; Jun Ye

(57) ABSTRACT

The present invention belongs to the technical field of 5G millimeter wave communication and discloses a 5G dual-band up-mixer with switching between amplification function and frequency mixing function, and terminal. The first double-balanced active mixer and the second double-balanced active mixer are connected in series, and both ends of the first double-balanced active mixer are connected with a first transformer and a second transformer respectively; both ends of the second double-balanced active mixer are respectively connected with the second transformer and the third transformer; the first double-balanced active mixer is provided with a first MOSFET and a fourth transformer connected with the first MOSFET; the second double-balanced (Continued)

active mixer is provided with a second MOSFET and a fifth transformer connected with the second MOSFET.

8 Claims, 1 Drawing Sheet

5G DUAL-BAND UP-MIXER WITH SWITCHING BETWEEN AMPLIFICATION FUNCTION AND FREQUENCY MIXING FUNCTION, AND TERMINAL

CROSS REFERENCE OF RELATED APPLICATION

The present application is a 371 of international Application PCT/CN2023/072102, filed Jan. 13, 2023, which claims priority to Chinese Patent Application No. 202210542488 filed May 18, 2022. The contents of the applications are incorporated herein by reference in their entireties.

TECHNICAL FIELD

The present invention belongs to the technical field of 5G millimeter wave communication, and in particular, relates to a 5G dual-band up-mixer with switching between amplification function and frequency mixing function, and terminal.

BACKGROUND

At present, the proposal and application of 5G millimeter wave technology require RF chips to simultaneously process RF information near two frequencies of 27 GHz and 39 GHz and realize dual-band transceiver communication. For the transmitter chip, it is not only necessary to amplify the signals of two frequency bands at the same time but also to adopt an appropriate frequency conversion method, so that the result of mixing the intermediate frequency (IF) signal and the local oscillator (LO) signal can cover the two RF bands.

Taking China's 5G millimeter-wave frequency bands 24.25-27.5 GHZ and 37.5-42.5 GHz as an example, for the single-frequency LO frequency conversion method, if the LO frequency is less than 24.25 GHz, before the dual-band up-conversion, the upper limit of the intermediate frequency will exceed 42.5 GHZ-24.25 GHZ=18.25 GHz; if the intermediate frequency is too high, the significance of up-conversion will be lost, and the design difficulty of the IF chain will be increased. Therefore, the common frequency up-conversion scheme adopts the method of changing the LO frequency and converts the LO frequency when the intermediate frequency is low, so as to cover two different frequency bands. The IF signal is 4-6 GHz, and the LO frequency is 20.25-36.5 GHz. The basic structure of its circuit is a common Gilbert-type active mixer or passive ring mixer. Although dual-band up-conversion can be achieved, there are still many problems. The corresponding disadvantages are as follows:

(1) The bandwidth pressure of the LO chain is relatively large. Although the intermediate frequency of this scheme is only 4-6 GHz, the local oscillator needs to be in the frequency band range of 20.25-36.5 GHz, and the relative bandwidth is about 57%, which will make the bandwidth design pressure of the LO chain relatively high. Especially, it is very difficult to design its frequency multiplier module.

(2) Sideband signals fall within the RF band. Due to the narrow IF bandwidth, the coverage of the RF band is mainly completed by the transformation of the LO frequency. In the process of LO frequency conversion, the sideband frequency of one local oscillator may be very close to, or even coincide with, the RF frequency of another local oscillator. For example, when the LO frequency is 22 GHz, the 26-28 GHz RF signal can be obtained by up-mixing. When the LO frequency is 32 GHZ, both the 36-38 GHz RF signal and the 26-28 GHz sideband signal can be obtained. This sideband signal is transmitted with the transmitter, causing interference to other devices that communicate using the 26-28 GHz RF band.

Through the above analysis, the problems and defects of the prior art are: in the application of 5G millimeter wave communication technology, the intermediate frequency information is up-converted to the frequency bands near 27 GHz and 39 GHz, and it is difficult to reduce the bandwidth design pressure of IF and LO chains.

SUMMARY

Targeting the problems existing in the prior art, the present invention provides a 5G dual-band up-mixer with switching of amplification and mixing functions.

The present invention is implemented in this way, and a 5G dual-band up-mixer with switching of amplification and mixing functions includes:

A first double-balanced active mixer and a second double-balanced active mixer;

The first double-balanced active mixer and the second double-balanced active mixer are connected in series. Both ends of the first double-balanced active mixer are respectively connected with the first transformer and the second transformer, and both ends of the second double-balanced active mixer are respectively connected with the second transformer and the third transformer;

The first double-balanced active mixer is provided with a first MOSFET and a fourth transformer connected to the first MOSFET;

The second double-balanced active mixer is provided with a second MOSFET and a fifth transformer connected to the second MOSFET.

Further, one end of the primary coil of the first transformer is connected to the IF signal port, and the other end is connected to ground; one end of the secondary coil is connected to the sources of the first MOSFETs M1 and M2, and the other end is connected to the sources of the first MOSFETs M3 and M4; the center tap of the secondary coil is ground;

Further, the gates of the first MOSFETs M1 and M4 are connected to the LO1+ signal terminal, and the gates of the first MOSFETs M2 and M3 are connected to the LO1− signal terminal; one end of the primary coil of the fourth transformer is connected to the LO1+ signal terminal, and the other end is connected to the LO1+ signal terminal; one end of the secondary coil is connected to the LO signal port, and the other end is connected to ground.

Further, a resistor R1 is connected between the LO1− signal terminal and the bias voltage Vb1, and a resistor R2 is connected between the LO1+ signal terminal and the bias voltage Vb1.

Further, one end of the primary coil of the second transformer is connected to the drains of the first MOSFETs M1 and M3, the other end is connected to the drains of the first MOSFETs M2 and M4, and the center tap is connected to the power supply Vdd;

One end of the secondary coil of the second transformer is connected to the sources of the second MOSFETs M5 and M6, the other end is connected to the sources of the second MOSFETs M7 and M8, and the center tap is connected to ground.

Further, the gates of the second MOSFETs M5 and M8 are connected to the LO2+ signal terminal, and the gates of the second MOSFETs M6 and M7 are connected to the LO2− signal terminal;

One end of the primary coil of the fifth transformer is connected in series with the switch S1 and the capacitor C1 to the LO2− signal end, and the other end is connected in series with the switch S2 and the capacitor C2 to the LO2+ signal end; one end of the secondary coil is connected to the LO signal end, and the other end is connected to ground.

Further, a resistor R3 is connected between the LO2− signal terminal and the bias voltage Vb2, and a resistor R4 is connected between the LO2+ signal terminal and the bias voltage Vb3.

Another purpose of the present invention is to provide a wireless communication terminal, and the wireless communication terminal is equipped with the 5G dual-band up-mixer with switching of amplification and mixing functions.

Another purpose of the present invention is to provide a 5G millimeter-wave communication terminal, wherein the 5G millimeter-wave communication terminal is provided with the 5G dual-band up-mixer with switching of amplification and mixing functions.

In combination with the above-mentioned technical solutions and the technical problems solved, please analyze the advantages and positive effects of the technical solutions to be protected by the present invention from the following aspects:

First, in view of the technical problems existing in the above-mentioned prior art and the difficulty of solving the problems, closely combine the technical solutions to be protected of the present invention and the results and data in the research and development process, etc., and analyze in detail and profoundly how to solve the technical solutions of the present invention, and some creative technical effects brought about by solving problems. The specific description is as follows:

In the present invention, two modules are connected in series, the first module is a mixer, and the second module can switch the two functional modes of the mixer and the amplifier by controlling the bias voltage and the signal switch, so as to mix the intermediate frequency and LO frequency for once or twice to achieve dual-band up-conversion, covering two millimeter-wave frequency bands.

The present invention adopts a two-stage common gate structure, which has higher gain compared with the traditional passive mixer, helps to improve the chain performance, and relieves the gain pressure of the post stage.

The sideband interference frequencies generated by the up-mixer of the present invention are all out of RF band and can be filtered out by matching network, so they will not interfere with the work of other communication devices.

The present invention improves the traditional dual-band frequency conversion method, and connects two double-balanced mixers in series, and the latter stage mixer can be switched to the amplifier function by controlling the bias voltage and the signal switch, so that the entire mixer can enable once mixing or twice mixing, respectively corresponding to the RF signals of two frequency bands, so dual-band up-conversion can be realized. The present invention also significantly reduces the requirement of the LO bandwidth of the dual-band millimeter wave system, so it does not bring greater design pressure to the intermediate frequency chain and the LO chain. The sideband frequencies generated by the present invention are all out of band and can be suppressed by matching network, so it will not cause interference to other devices.

Second, considering the technical solution as a whole or from the product point of view, the technical effects and advantages of the technical solution to be protected by the present invention are specifically described as follows:

The 5G dual-band up-mixer with mixing of amplification and mixer functions as provided by the present invention can realize up-conversion covering two millimeter wave frequency bands of 5G communication in China at intermediate frequency of 4-6 GHz and LO frequency of 20-24 GHZ, reducing the design pressure of the LO chain and the intermediate frequency chain. Moreover, the sideband frequencies generated by the mixer are all out of band, which can be suppressed by matching network, so it will not cause interference to other communication devices.

Third, as an auxiliary evidence of inventive step of the claims of the present invention, it is also reflected in the following important aspects: the expected benefit and commercial value after the technical solution of the present invention is converted are as follows: use more concise wiring and smaller power consumption to achieve dual-band up-conversion of 5G millimeter wave, and make full use of 5G spectrum resources while saving chip area and chip power consumption.

In the figure: 1, the first transformer; 2, the second transformer; 3, the third transformer; 4, the fourth transformer; 5, the fifth transformer

EMBODIMENTS

In order to make the purposes, technical solutions, and advantages of the present invention more fully apparent, further details of the present invention are set forth with reference to the embodiments. It should be appreciated that the specific embodiments described herein are merely illustrative of the present invention and are not intended to be limiting of the present invention.

1. Explain the embodiment. In order for those skilled in the art to fully understand how the present invention is specifically implemented, this part is an explanatory embodiment to expand the description of the technical solutions of the claims.

Figure 1:
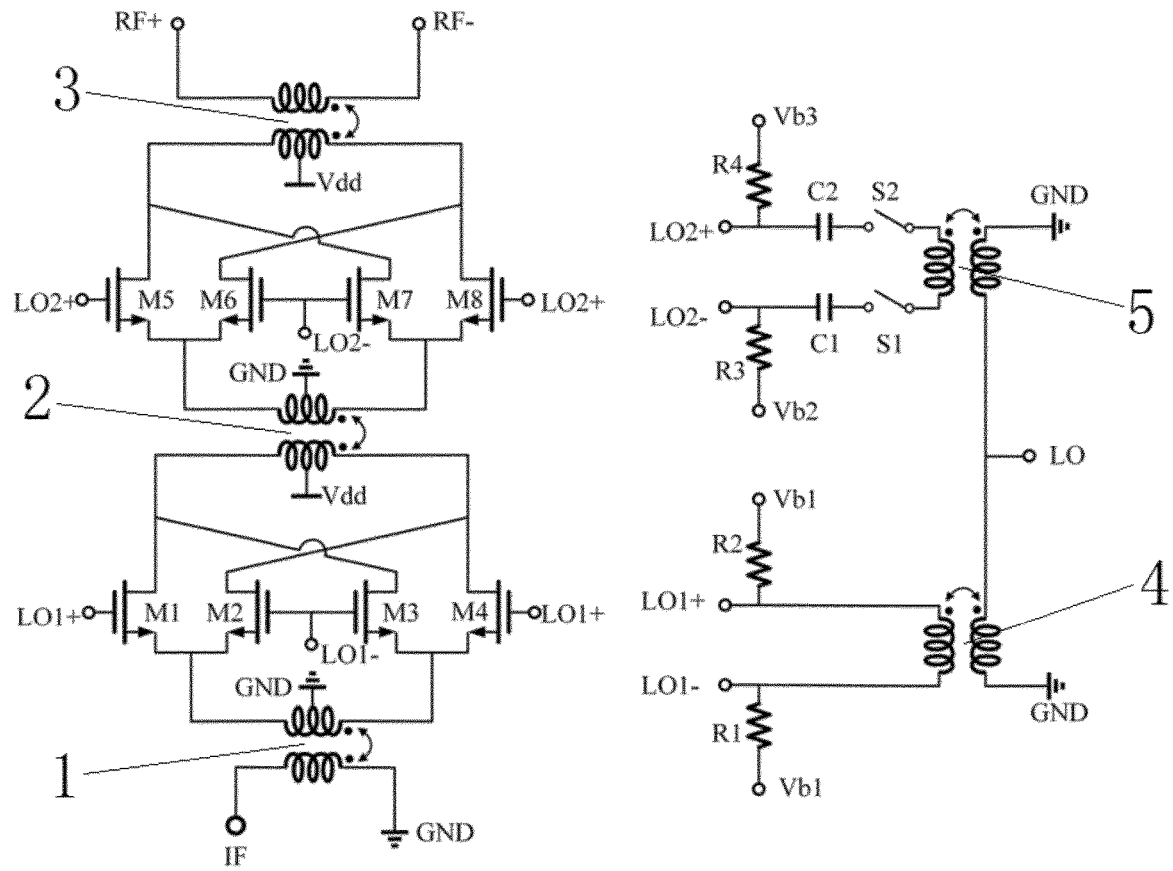
FIG. 1 is a schematic structural diagram of a 5G dual-band up-mixer with mixing of amplification and mixing functions provided in an embodiment of the present invention.

As shown in FIG. 1, the core part of the 5G dual-band up-mixer with amplification and mixing functions provided by the embodiment of the present invention is two series-connected double-balanced active mixers, which transmit signals and impedance matching through transformer coupling; a signal control part is introduced at the LO end, and while providing the bias voltage, the function switching of the mixer and the amplifier is realized, thereby realizing dual-band mixing.

One end of the primary coil of the first transformer 1 is connected to the intermediate frequency signal port, one end is connected to ground, one end of the secondary coil is connected to the sources of the MOSFETs M1 and M2, one end is connected to the sources of the MOSFETs M3 and M4, and the center tap of the secondary coil is connected to ground; the gates of the transistors M1 and M4 are connected to the LO1+ signal, and the gates of the MOSFETs M2 and M3 are connected to the LO1− signal; one end of the primary coil of the secondary transformer is connected to the drains of M1 and M3, and the other end is connected to the drains of M2 and M4, and the center tap is connected to the power supply Vdd, one end of the secondary coil is connected to the source of MOSFETs M5 and M6; one end is connected to the source of MOSFETs M7 and M8, and the center tap is connected to ground; the gates of MOSFETs M5 and M8 are connected to LO2+ signal, and the gates of the MOSFETs M6 and M7 are connected to the LO2− signal;

One end of the primary coil of the third transformer 3 is connected to the drains of M5 and M7, one end is connected to the drains of M6 and M8, the center tap is connected to the power supply Vdd, and both ends of the secondary coil are respectively connected to the two differential ports RF+ and RF− of the RF signal;

One end of the primary coil of the fourth transformer 4 is connected to LO1+, one end is connected to LO1−, one end of the secondary coil is connected to the LO signal port, and one end is connected to ground;

One end of the primary coil of the fifth transformer 5 is connected in series with switch S1 and capacitor C1 to LO2−, one end is connected in series with switch S2 and capacitor C2 to LO2+, one end of the secondary coil is connected to the LO signal end, and one end is connected to ground; both ends of the resistor R1 are respectively connected to the bias voltages Vb1 and LO1−, both ends of the resistor R2 are connected to the bias voltages Vb1 and LO1+ respectively, both ends of the resistor R3 are respectively connected to the bias voltages Vb2 and LO2−, and both ends of the resistor R4 are respectively connected to the bias voltages Vb3 and LO2+.

M1-M4 constitute the core switch stage of the first mixer, and the structure is a double-balanced active mixer. The intermediate frequency signal is coupled from the first transformer into the source of M1-M4, and the bias voltage Vb1 biases M1~4 near the threshold voltage through the AC isolation resistors R1 and R2; the LO signal is coupled from the fourth transformer to LO1+ and LO1−, and then connected to the gates of M1~M4 to control M1~M4 to turn on and off in turn and realize frequency mixing. The sum of the angular frequencies of the first mixer output signal is $\omega_{IF1}=\omega_{LO}+\omega_{IF}$ and $\omega_{IF2}=\omega_{LO}-\omega_{IF}$.

Figure 2:
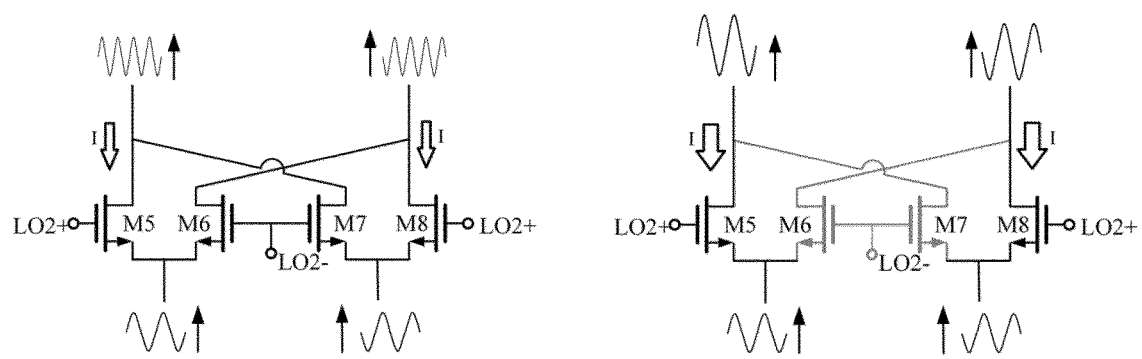
FIG. 2 is a schematic diagram of working states of M5 to M8 under two functions of a mixer and an amplifier provided in an embodiment of the present invention.

M5-8 have two functional modes of mixer mode and amplifier mode. When M5-8 works in mixer mode, switches S1 and S2 are turned on, M5-8 constitutes the core switch tube of the second mixer, and the structure is a double-balanced active mixer, as shown in FIG. 2. The mixed IF1 and IF2 signals are coupled from the second transformer into the source of M5-8. The bias voltages Vb2 and Vb3 bias M5-8 near the threshold voltage through the AC isolation resistors R3 and R4. The LO signal is coupled from the fifth transformer and capacitors C1 and C2 to the two differential terminals of LO2+ and LO2− respectively, and then connected to the gates of M5-8 to control M5-8 to turn on and off in turn and realize frequency mixing, so it can output more high-frequency signals. The angular frequency of the second mixer output signal is $\omega_{IF}$, $\omega_{RF}=\omega_{LO}+\omega_{IF2}=2\omega_{LO}-\omega_{IF}$ and $\omega_{side}=\omega_{LO}+\omega_{IF1}=2\omega_{LO}+\omega_{IF}$. Among them, the intermediate frequency is generated because the LO frequency of double-frequency mixing is the same, and a LO frequency is added first, and then a LO frequency is subtracted.

When M5~M8 work in amplifier mode, switches S1 and S2 are turned off, so no high-power LO signal will enter the gates of M5~M8, Vb2 is biased at ground potential, so M6 and M7 are turned off and Vb3 is biased at more than 50 mV higher than the threshold voltage. M5 and M8 work in the state of a common gates amplifier[2], and the DC current becomes larger. At this time, this part can amplify the signal but will not change the frequency of the input signal. The sum of the LO frequency and intermediate frequency is the output radio frequency $\omega_{RF}=\omega_{IF1}=\omega_{LO}+\omega_{IF}$.

The second transformer 2 and the third transformer 3 realize signal coupling and matching filtering. The third transformer 3 filters out the frequency band information of 24.25-42.5 GHz in combination with the impedances of upper and lower stages, while the second transformer 2 filters out the 16.5-27.5 GHz band information in combination with the impedances of upper and lower stages.

At the intermediate frequency of 5 GHz, if M5~M8 work in the mixer mode, the entire up-mixing is performed twice, and the output RF frequency is 2×22 GHz−5 GHZ=39 GHz. The generated sideband frequency 2×22 GHz+5 GHZ=49 GHZ and intermediate frequency 5 GHz are out-of-band and will be filtered out with matching network, so it will not interfere with the communication of other devices; if M5~M8 work in amplifier mode, the entire up-mixing is only performed once. The output RF frequency 22 GHz+5 GHZ=27 GHZ and the generated sideband frequency 22 GHz−5 GHZ=17 GHz are out of the band and will be filtered out with matching network, so they will not interfere with the communication of other devices.

This once mixing and twice mixing switching method enables LO and IF to correspond to the information of two different RF bands only by switching the mode when the frequency remains unchanged, and the bandwidth design pressure is greatly reduced. When the intermediate frequency bandwidth is $f_{if1}$~$f_{if2}$ and the LO range is $f_{LO1}$~$f_{LO2}$, the RF end of the mixer can cover two frequency bands, $f_{if1}+f_{lo1}$~$f_{if2}+f_{lo2}$ and $2\times f_{lo1}-f_{if2}$~$2\times f_{lo2}-f_{if1}$. If the intermediate frequency signal is 4-6 GHz and the LO signal is 20-24 GHz, it can cover the two millimeter-wave frequency bands of China's 5G communication, and the generated sideband frequencies are all out-of-band, which can be suppressed by matching network to reduce the interference to other devices.

2. Application examples. In order to prove the inventive step and technical value of the technical solution of the present invention, this part is an application example of the technical solution in the claims on specific products or related technologies.

The present invention is provided with a 5G communication system with a 5G dual-band up-mixer with mixing of amplification and mixing functions.

3. Evidence of the relevant effects of the embodiment. The embodiments of the present invention have achieved some positive effects in the process of research and development or use, and indeed have great advantages compared with the prior art. The following contents are described in combination with the data and charts of the test process.

Under the condition that the intermediate frequency is 4-6 GHz, in order to cover the two frequencies of the 5G millimeter wave, the traditional solution requires the LO bandwidth to be 20.25 GHz-21.5 GHz and 33.5 GHz-36.5 GHz. This wide span of two frequency bands will bring greater design pressure to components such as the VCO and frequency multiplier of the LO chain, and it will also introduce difficulties for the matching of the mixer gates. However, the LO of the present invention only needs a signal in a frequency band of 20-24 GHZ, thus greatly reducing the design pressure of the LO chain. The sideband frequencies of the traditional solution will be transmitted with the transmitter and affect other communication devices. The sideband frequencies of the present invention are all out-of-band and can be suppressed, so they will not interfere with other devices.

The above are only specific embodiments of the present invention, but the protection scope of the present invention is not limited to this. Any modification, equivalent substitution and improvement made by any person skilled in the art within the technical scope disclosed by the present invention and within the spirit and principles of the present invention shall be covered by the scope of protection of the present invention.

The invention claimed is:

1. A 5G dual-band up-mixer with switching of amplification and mixing functions, comprises:
a first double-balanced active mixer and a second double-balanced active mixer, wherein
the first double-balanced active mixer and the second double-balanced active mixer are connected in series;
the ends of the first double-balanced active mixer are respectively connected with a first transformer and a second transformer;
the ends of the second double-balanced active mixer are respectively connected with the second transformer and a third transformer;
the first double-balanced active mixer is provided with a first MOSFET set (M1, M2, M3, and M4) and a fourth transformer connected to the first MOSFET set, and
the second double-balanced active mixer is provided with a second MOSFET set (M5, M6, M7, and M8) and a fifth transformer connected to the second MOSFET set.

2. The 5G dual-band up-mixer with switching of amplification and mixing functions according to claim 1, wherein
one end of the primary coil of the first transformer is connected to an IF signal port, and the other end of the primary coil of the first transformer is connected to ground; and
one end of the secondary coil of the first transformer is connected to the sources of MOSFET (M1) and MOSFET (M2), the other end of the secondary coil of the first transformer is connected to the sources of MOSFET (M3) and MOSFET (M4), and the center tap of the secondary coil of the first transformer is connected to ground.

3. The 5G dual-band up-mixer with switching of amplification and mixing functions according to claim 1, wherein the gates of MOSFET (M1) and MOSFET (M4) are connected to a LO1+ signal terminal, and the gates of MOSFET (M2) and MOSFET (M3) are connected to a LO1− signal terminal; wherein
one end of the primary coil of the fourth transformer is connected to the LO1+ signal terminal, and the other end of the primary coil of the fourth transformer is connected to the LO1− signal terminal; and
one end of the secondary coil of the fourth transformer is connected to a LO signal port, and the other end of the secondary coil of the fourth transformer is connected to ground.

4. A 5G dual-band up-mixer with switching of amplification and mixing functions according to claim 1, wherein a first resistor (R1) is connected between the LO1− signal terminal and a first bias voltage (Vb1), and a second resistor (R2) is connected between the LO1+ signal terminal and the first bias voltage.

5. The 5G dual-band up-mixer with switching of amplification and mixing functions according to claim 1, wherein
one end of the primary coil of the second transformer is connected to the drains of MOSFET (M1) and MOSFET (M3), the other end of the primary coil of the second transformer is connected to the drains of MOSFET (M2) and MOSFET (M4), and the center tap of the primary coil of the second transformer is connected to a power supply (Vdd); and
one end of the secondary coil of the second transformer is connected to the sources of MOSFET (M5) and MOSFET (M6), the other end of the secondary coil of the second transformer is connected to the sources of MOSFET (M7) and MOSFET (M8), and the center tap of the secondary coil of the second transformer is connected to ground.

6. The 5G dual-band up-mixer with switching of amplification and mixing functions according to claim 1, wherein the gates of MOSFET (M5) and MOSFET (M8) are connected to LO2+ signal terminal, and the gates of MOSFET (M6) and MOSFET (M7) are connected to a LO2− signal terminal.

7. The 5G dual-band up-mixer with switching of amplification and mixing functions according to claim 6, wherein
one end of the primary coil of the fifth transformer is connected in series with a first switch (S1) and a first capacitor (C1) to the LO2− signal terminal, and the other end of the primary coil of the fifth transformer is connected in series with a second switch (S2) and a second capacitor (C2) to the LO2+ signal terminal; and
one end of the secondary coil of the fifth transformer is connected to the LO signal port, and the other end of the secondary coil of the fifth transformer is connected to ground.

8. The 5G dual-band up-mixer with switching of amplification and mixing functions according to claim 6, wherein
a third resistor (R3) is connected between the LO2− signal terminal and a second bias voltage (Vb2), and
a fourth resistor (R4) is connected between the LO2+ signal terminal and a third bias voltage (Vb3).

* * * * *